United States Patent
Butcher et al.

(10) Patent No.: US 7,494,825 B2
(45) Date of Patent: Feb. 24, 2009

(54) TOP CONTACT ALIGNMENT IN SEMICONDUCTOR DEVICES

(75) Inventors: Brian R. Butcher, Queen Creek, AZ (US); Kerry J. Nagel, Phoenix, AZ (US); Kenneth H. Smith, Chandler, AZ (US)

(73) Assignee: Freescale Semiconductor, Inc., Austin, TX (US)

( * ) Notice: Subject to any disclaimer, the term of this patent is extended or adjusted under 35 U.S.C. 154(b) by 0 days.

(21) Appl. No.: 11/649,094

(22) Filed: Jan. 3, 2007

(65) Prior Publication Data

US 2008/0160640 A1    Jul. 3, 2008

(51) Int. Cl.
*H01L 21/00* (2006.01)
*H01L 21/461* (2006.01)
*H01L 23/544* (2006.01)

(52) U.S. Cl. .................. 438/3; 438/692; 438/975; 257/797; 257/E23.179

(58) Field of Classification Search ................ 438/3, 438/673, 675
See application file for complete search history.

(56) References Cited

U.S. PATENT DOCUMENTS

| | | | | |
|---|---|---|---|---|
| 6,046,758 A * | 4/2000 | Brown et al. | ................. | 347/203 |
| 2003/0186552 A1 * | 10/2003 | Amano et al. | ............... | 438/694 |
| 2004/0018645 A1 * | 1/2004 | Drewes | .................. | 438/3 |
| 2004/0266188 A1 * | 12/2004 | Kondo et al. | ................. | 438/689 |
| 2005/0141148 A1 * | 6/2005 | Aikawa et al. | ......... | 360/324.11 |
| 2006/0060908 A1 | 3/2006 | Mikawa et al. | | |
| 2007/0215911 A1 * | 9/2007 | Torng et al. | ................. | 257/256 |

* cited by examiner

*Primary Examiner*—Hsien-ming Lee
*Assistant Examiner*—Kevin A Parendo
(74) *Attorney, Agent, or Firm*—Ingrassia, Fisher & Lorenz, P.C.

(57) ABSTRACT

According to an example embodiment, a semiconductor device includes a lower electrode (316) disposed on an oxide layer (302), an upper electrode (320) disposed on the lower electrode, a dielectric pattern (322) disposed on the oxide layer and surrounding the upper electrode, the upper electrode protruding above an upper surface of the dielectric pattern, and a contact pattern (328) that is contiguous with the upper electrode and the dielectric pattern.

17 Claims, 3 Drawing Sheets

TOP CONTACT ALIGNMENT IN SEMICONDUCTOR DEVICES

FIELD OF THE INVENTION

This disclosure generally relates to semiconductor devices, and more particularly relates to top contact alignment in a semiconductor device such as a magnetoresistive random access memory (MRAM) device.

BACKGROUND OF THE INVENTION

Vias are known in the art as structures that may be used to electrically connect a lower conductive structure such as a contact, pad, layer, or pattern to an upper conductive structure such as a contact, pad, layer, or pattern that is vertically separated from the lower conductive structure. Vias typically penetrate vertically through one or more horizontally arranged structural layers that separate the lower conductive structure and the upper conductive structure.

MRAM devices are also known. For purposes of this disclosure, a complete and thorough discussion of the structure and workings of an MRAM device is not necessary, as the basic knowledge of these devices possessed by those of skill in the art is sufficient for understanding the inventive aspects that are discussed below in the detailed description of example embodiments.

Vias have frequently been used to electrically connect a local interconnect layer with the top electrode of an MRAM memory bit. In order to reduce the cost and improve the performance of the MRAM device, it has been proposed that, rather than connect the local interconnect layer to the top electrode of the MRAM memory bit using a via, the top electrode of the MRAM memory bit might instead directly contact the local interconnect. This can be accomplished through the planarization of deposited dielectric to the top of the top electrode.

After the planarization of the dielectric to the top of the top electrode, a contact metal layer is typically deposited on the top electrode of the MRAM memory bit and the surrounding dielectric. The deposition of the contact metal layer over the top electrode creates an opaque, reflective surface that can not be aligned. That is, the surface of the contact metal layer does not provide clues or indications as to where the underlying top electrode is positioned, making it impossible to align subsequent layers that must have a specific geometry relative to the top electrode. To solve this problem, a photo lithography mask and etch steps are performed on top of the contact metal layer to form a key. The key can then be used to properly align the contact metal layer.

FIG. 1 is a cross-sectional diagram illustrating a MRAM device where the top electrode 102 of the MRAM memory bit is connected to the local interconnect 104 using a via 106, while FIG. 2 is a cross-sectional diagram illustrating a MRAM device where the top electrode 102 of a MRAM memory bit is connected directly to the local interconnect 104. Compared to FIG. 1, it can be seen that the MRAM device of FIG. 2 does not require a deposition process such as a chemical vapor deposition (CVD) process to add the layer 108 of FIG. 1. The MRAM device of FIG. 2 additionally eliminates a cleaning process, a photo mask process, and an etch process that would otherwise be needed to create the spaces that are needed for the vias 106 of FIG. 1.

In addition to the benefit of reduced cost, the elimination of layer 108 in FIG. 2 brings the upper write line 110 closer to the top electrode 102, which improves the functionality of the MRAM device by reducing the current required to switch the memory state of the device.

While the structure illustrated in FIG. 2 can achieve reduced cost and improved functionality, it is offset by the fact that elimination of the vias still requires a key photolithography mask and etching process on the contact metal layer for proper alignment, as was explained above. Embodiments of the invention address this and other disadvantages of the conventional art.

BRIEF DESCRIPTION OF THE DRAWINGS

Example embodiments of the invention will hereinafter be described in conjunction with the following drawing figures, wherein like numerals denote like elements, and wherein.

DETAILED DESCRIPTION OF EXAMPLE EMBODIMENTS

Figure 1:
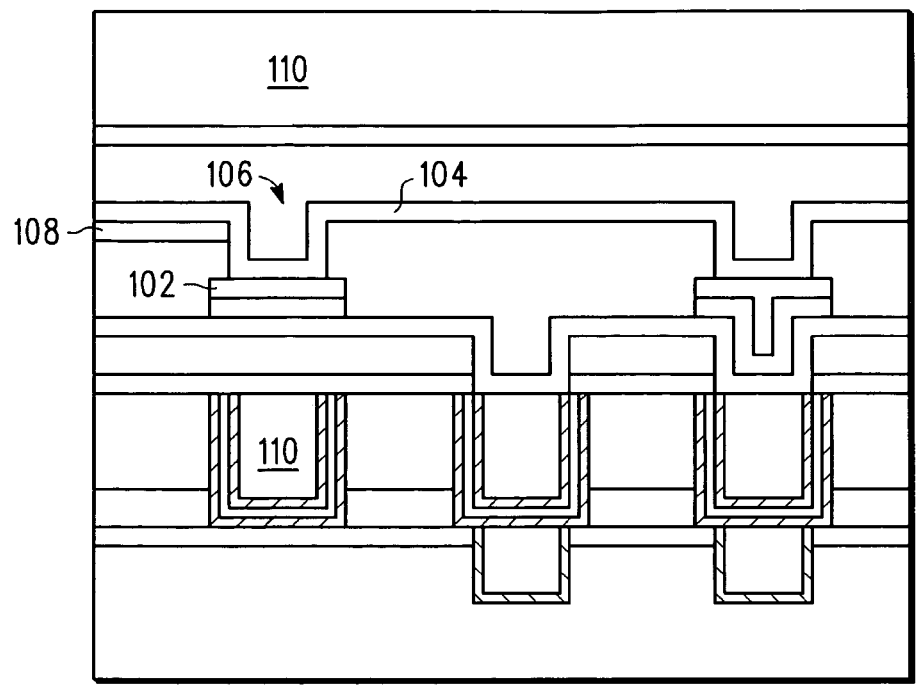
FIG. 1 is a cross-sectional diagram illustrating a conventional MRAM device where the top electrode of the MRAM memory bit is connected to the local interconnect using a via.
Figure 2:
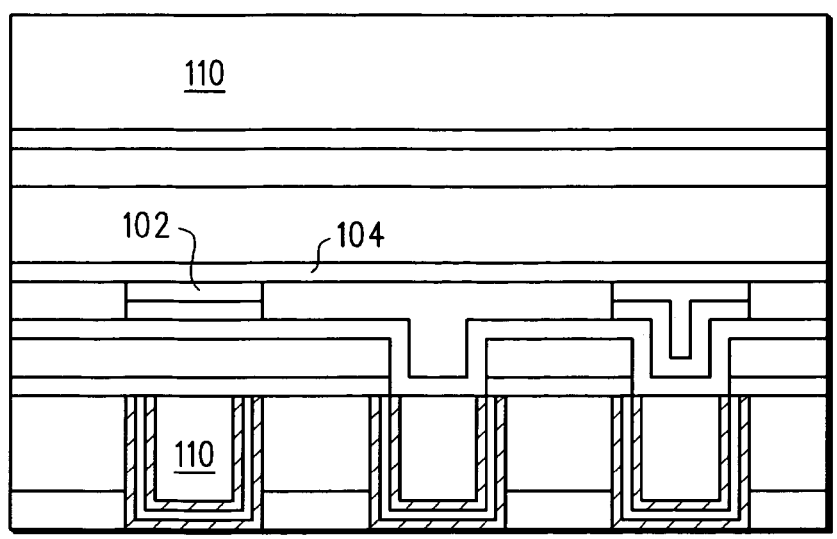
FIG. 2 is a cross-sectional diagram illustrating a conventional MRAM device where the top electrode of the MRAM memory bit is connected directly to the local interconnect

The following detailed description of example embodiments is not intended to limit the invention or the application and uses of the invention. Furthermore, there is no intention to be bound by any expressed or implied theory presented in the preceding technical field, background, or the following detailed description of example embodiments. Furthermore, other desirable features and characteristics of the invention will become apparent from the subsequent detailed description and the appended claims, taken in conjunction with the accompanying drawings and the foregoing technical field and background.

For simplicity and clarity of illustration, the drawing figures illustrate the general manner of construction, and descriptions and details of well-known features and techniques may be omitted to avoid unnecessarily obscuring aspects of the invention. Additionally, elements in the drawings figures are not necessarily drawn to scale. For example, the dimensions of some of the elements or regions in some of the figures may be exaggerated relative to other elements or regions of the same or other figures to help improve understanding of the example embodiments.

The terms "first," "second," "third," "fourth" and the like in the description and the claims, if any, may be used for distinguishing between similar elements and not necessarily for describing a particular sequential or chronological order. It is to be understood that the terms so used are interchangeable under appropriate circumstances such that the embodiments of the invention described herein are, for example, capable of use in sequences other than those illustrated or otherwise described herein. Furthermore, the terms "comprise," "include," "have" and any variations thereof, are intended to cover non-exclusive inclusions, such that a process, method, article, or apparatus that comprises includes, or has a list of elements is not necessarily limited to those elements, but may include other elements not expressly listed or inherent to such process, method, article, or apparatus. The terms "left,"

"right," "in," "out," "front," "back," "up," "down," "top," "bottom," "over," "under," "above," "below" and the like in the description and the claims, if any, are used for describing relative positions and not necessarily for describing permanent positions in space. It is to be understood that the example embodiments described herein may be used, for example, in other orientations than those illustrated or otherwise described herein.

Figure 3:
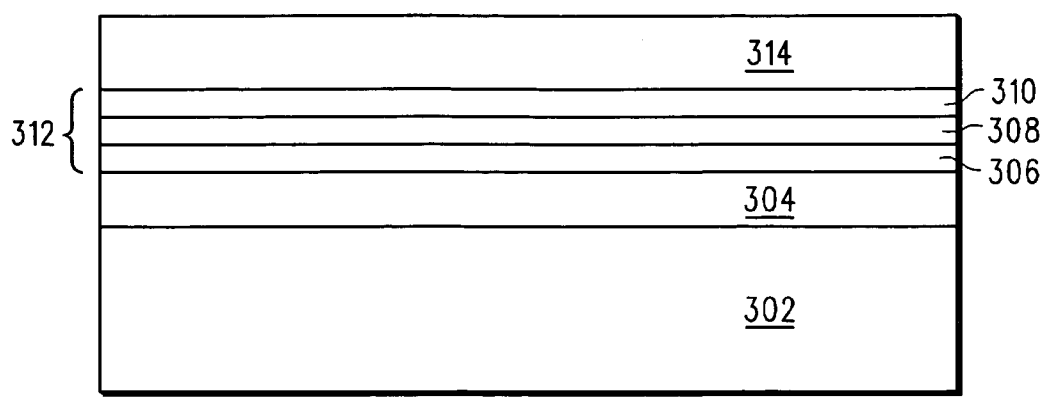
FIGS. 3-8 are cross-sectional diagrams illustrating some structures included in a MRAM device according to an example embodiment as well as processes included in a method of fabricating a MRAM device according to an example embodiment.

For convenience of explanation that is not intended to be limiting, the example embodiments that are described below involve top contact alignment in MRAM devices. That is, those of skill in the art will recognize that the inventive aspects taught by the example embodiments may be applied to any semiconductor device structure or fabrication method that utilizes a contact metal layer over a contact FIGS. 3-8 are cross-sectional diagrams illustrating processes included in a method of fabricating a MRAM device according to an example embodiment. Referring to FIG. 3, an oxide layer 302 is deposited on a substrate (not shown). Next, a lower electrode layer 304 is formed on the oxide layer 302. Magnetic Tunnel Junction (MTJ) multi-layer 312 is formed on the lower electrode layer 304. The MTJ multi-layer 312 includes a fixed magnetic layer 306, a thin dielectric tunnel barrier layer 308, and a free magnetic layer 310. Generally speaking, an MRAM device has a MTJ multi-layer that includes a fixed magnetic layer, a thin dielectric tunnel barrier layer, and a free magnetic layer. Next, an upper electrode layer 314 is formed on the MTJ multi-layer 312. In some embodiments of the invention, the upper electrode layer consists of Tantalum Nitride (TaN).

Figure 4:
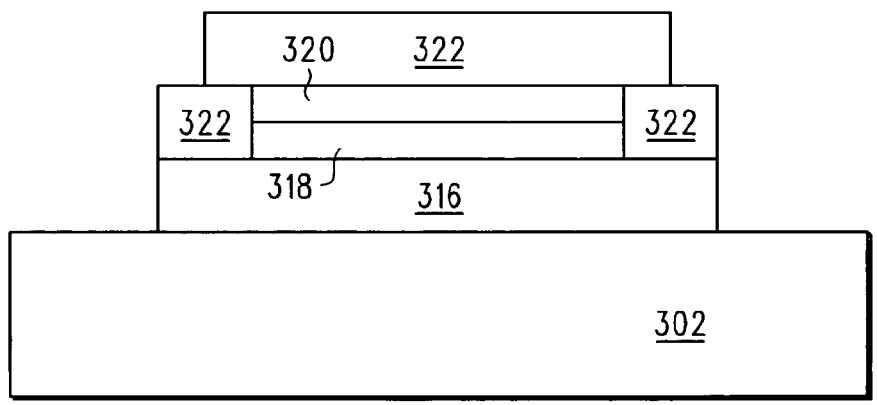

Referring to FIG. 4, the lower electrode layer 304, the MTJ multi-layer 312, and the upper electrode layer 314 are etched to form a lower electrode pattern 316, a MTJ pattern 318, and an upper electrode pattern 320. In this embodiment, the combined thickness of the upper electrode pattern 320 and the MTJ pattern 318 is approximately 1000 Å. An oxide layer 322 is formed on upper surfaces of the lower electrode pattern 316 and the upper electrodepattern 320.

Figure 5:
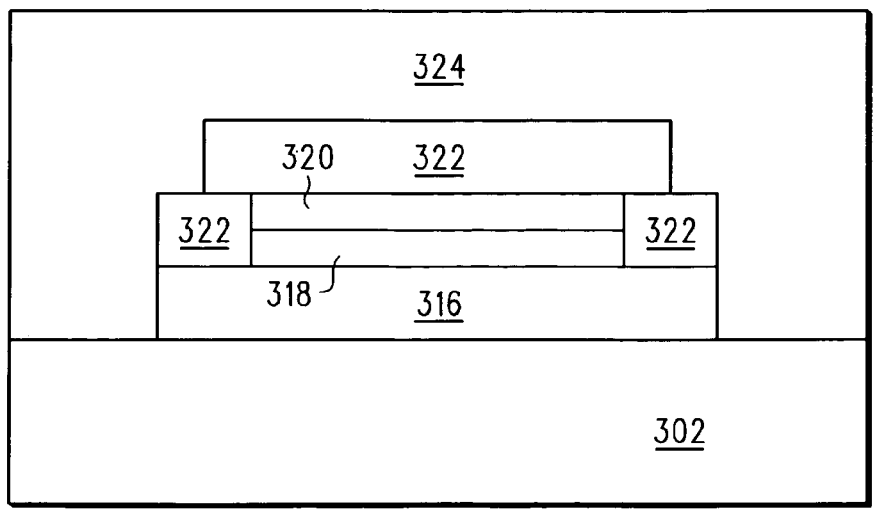
Figure 6:
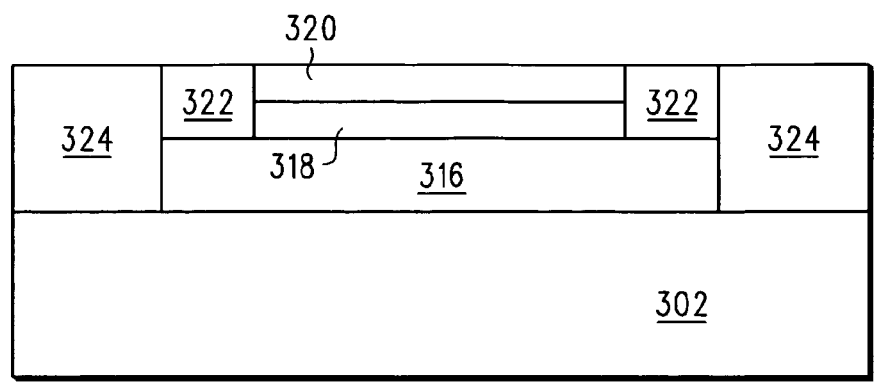

Referring to FIG. 5, a blanket oxide layer 324 is deposited over the lower electrode pattern 316 and the upper electrode pattern 320. In other example embodiments of the invention, the blanket oxide layer 324 may be replaced by a nitride layer. Referring to FIG. 6, the blanket oxide layer 324 is polished, using a chemical-mechanical polishing (CMP) process, until an upper surface of the upper electrode pattern 320 is exposed.

Figure 7:
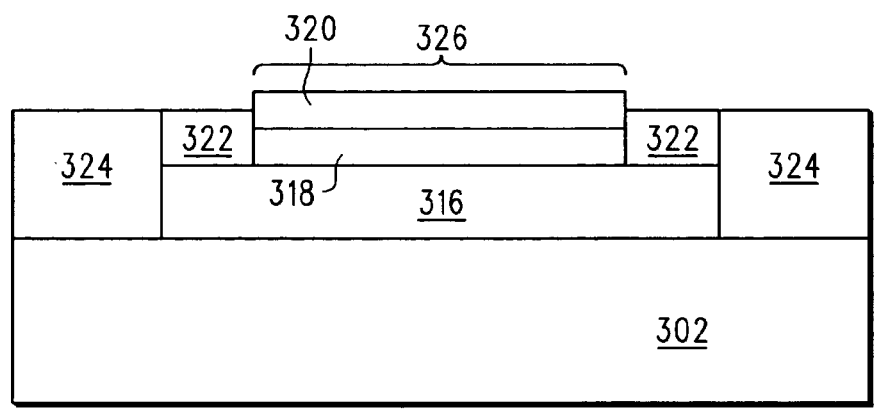

Referring to FIG. 7, an etch process is performed on the oxide layer 322, the blanket oxide layer 324, and the upper electrode pattern 320. According to various embodiments, the etch process is selective to the upper electrode pattern 320. In some embodiments, the etch process is an anisotropic dry etch that is performed by sputtering the oxide layer 322, the blanket oxide layer 324, and the upper electrode pattern 320 with high energy Argon (Ar) and Nitrogen ($N_2$) ions.

According to some embodiments, the Ar—$N_2$ sputtering achieved a measured selectivity of substantially 10:1 between the oxide layers 322, 324 and the upper electrode pattern 320 when the oxide layers 322, 324 were composed of tetraethyl orthosilicate (TEOS) oxide and the upper electrode pattern 320 was composed of TaN. As a result of the dry etch process, a stud structure 326 is created where the upper electrode pattern 320 protrudes above the oxide layers 322, 324.

In some embodiments, the stud structure 326 extends above the oxide layers 322, 324 by approximately 300 angstroms (Å). According to other embodiments, the stud structure 326 may alternatively be formed using an isotropic wet etch process, although the dry etch process described above is preferred.

Figure 8:
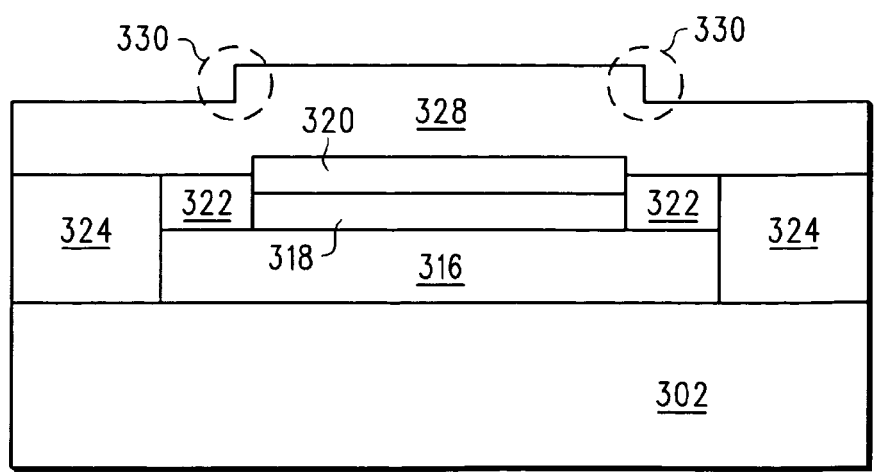

Referring to FIG. 8, a contact metal layer 328 is deposited over the stud structure 326, the oxide layer 322, and the blanket oxide layer 324. Because of the stud structure 326 that lies beneath it, the contact metal layer 328 exhibits a step 330. The presence of the step 330 advantageously creates topography in the contact metal layer 328 that enables standard lithography techniques to align and print the next layer. Thus, unlike the conventional techniques that were described in the background section of this disclosure, there is no need to perform a photolithography mask and etch steps on top of the contact metal layer 328 to form a key that can be used for the alignment.

The invention may be practiced in many ways. What follows are exemplary, non limiting descriptions of example embodiments of the invention.

According to an example embodiment, a method includes polishing a blanket layer until an upper electrode of a semiconductor device is exposed, selectively etching the blanket layer and the upper electrode such that the upper electrode forms a stud structure where it protrudes above a surface of the blanket layer, depositing a contact metal layer on the stud structure and the surface of the blanket layer such that a step is formed in the contact metal layer, and aligning the contact metal layer for placement of a subsequent layer using the step.

According to another example embodiment, polishing includes polishing the blanket layer until an upper electrode of a magnetoresistive random access memory (MRAM) device is exposed. According to another example embodiment, selectively etching includes wet etching. According to another example embodiment, the blanket layer includes TEOS oxide and the upper electrode includes tantalum nitride (TaN). According to another example embodiment, selectively etching the blanket layer and the upper electrode includes dry etching the blanket layer and the upper electrode by sputtering with high energy Argon (Ar) and Nitrogen ($N_2$) ions. According to another example embodiment, the selectivity between the blanket layer and upper electrode is approximately at least 10:1. According to another example embodiment, selectively etching the upper electrode and the blanket layer includes etching until the stud structure protrudes at least 300 Å above the surface of the blanket layer.

According to an example embodiment a semiconductor device includes a lower electrode disposed on an oxide layer, an upper electrode disposed on the lower electrode, a dielectric pattern disposed on the oxide layer and surrounding the upper electrode, the upper electrode protruding above an upper surface of the dielectric pattern and a contact pattern that directly contacts the upper electrode and the dielectric pattern.

According to another example embodiment, the upper electrode includes tantalum nitride (TaN). According to another example embodiment, the dielectric pattern includes tetraethyl orthosilicate (TEOS) oxide. According to another example embodiment, the upper electrode protrudes above the upper surface of the dielectric pattern by at least 300 Å.

According to another example embodiment, the semiconductor device further includes a magnetoresistive tunnel junction (MTJ) disposed between the lower electrode and the upper electrode. According to another example embodiment, the contact pattern directly contacts the upper electrode without using a via. According to another example embodiment, the contact pattern includes means for aligning a structural layer disposed on the contact pattern to the upper electrode. According to another example embodiment, the contact pattern includes a step structure in an upper surface of the contact pattern, the step structure adapted to align a structural layer disposed on the contact pattern to the upper electrode.

According to a different example embodiment, a magnetoresistive random access memory (MRAM) device includes an oxide layer, a lower electrode-disposed on the oxide layer, a magnetoresistive tunnel junction (MTJ) disposed on the lower electrode, an upper electrode disposed on the MTJ, a dielectric pattern disposed on the oxide layer, the dielectric pattern surrounding the lower electrode, the MTJ, and the upper electrode, a portion of the upper electrode protruding above an upper surface of the dielectric pattern a metal contact pattern that physically contacts the portion of the upper electrode and the upper surface of the dielectric pattern, the metal contact pattern including a step structure disposed substantially above an edge of the upper electrode, the step structure adapted to align a structural layer disposed on the metal contact pattern to the edge of the upper electrode.

According to another example embodiment, the dielectric pattern includes an oxide. According to another example embodiment, the oxide includes tetraethyl orthosilicate (TEOS) oxide and the upper electrode includes tantalum nitride (TaN). According to another example embodiment, the dielectric pattern includes a nitride. According to another example embodiment, the the portion of the upper electrode protrudes above the upper surface of the dielectric pattern by at least 300 Å.

While at least one example embodiment has been presented in the foregoing detailed description, it should be appreciated that a vast number of variations exist, especially with respect to choices of device types and materials and the sequence of processes. The above-described invention is especially useful for formation of MRAM devices, but persons of skill in the art will understand based on the description herein that other types of devices can also be fabricated using the principles taught by the example embodiments. For example, the inventive principles taught by the example embodiments could be applied to any semiconductor device having a structure where a contact metal layer is applied directly on an underlying contact rather than using a via to electrically connect the contact metal layer to the contact.

It should be emphasized that the example embodiments described above are only examples, and are not intended to limit the scope, applicability, or configuration of the invention in any way. Rather, the detailed description of the example embodiments provides those skilled in the art with a convenient road map for implementing the inventive principles contained in the example embodiments. The inventors regard the subject matter of the invention to include all combinations and subcombinations of the various elements, features, functions and/or properties disclosed herein.

It also should be understood that various changes can be made in the function and arrangement of elements without departing from the scope of the invention as set forth in the appended claims and the legal equivalents thereof.

The invention claimed is:

1. A method comprising:
   polishing a blanket layer until an upper electrode of a semiconductor device is exposed;
   selectively etching the blanket layer and the upper electrode such that the upper electrode forms a stud structure where it protrudes above a surface of the blanket layer;
   depositing a contact metal layer on the stud structure and the surface of the blanket layer such that a topographical feature is formed in the contact metal layer above the stud structure, wherein the topographical feature comprises at least one step between first and second portions of the contact metal layer; and
   aligning the contact metal layer for placement of a subsequent layer using the topographical feature.

2. The method of claim 1, wherein polishing comprises polishing the blanket layer until an upper electrode of a magnetoresistive random access memory (MRAM) device is exposed.

3. The method of claim 2, wherein selectively etching comprises wet etching.

4. The method of claim 2, wherein the blanket layer comprises TEOS oxide and the upper electrode comprises tantalum nitride (TaN).

5. The method of claim 4, wherein selectively etching the blanket layer and the upper electrode comprises dry etching the blanket layer and the upper electrode by sputtering with high energy Argon (Ar) and Nitrogen ($N_2$) ions.

6. The method of claim 1, wherein selectively etching the upper electrode and the blanket layer comprises etching until the stud structure protrudes at least 300 Å above the surface of the blanket layer.

7. A method for forming an alignment feature on a semiconductor device having an electrode and a blanket layer formed over the electrode, the method comprising:
   polishing the blanket layer until the electrode is exposed;
   selectively etching the blanket layer and the electrode to form a stud structure that protrudes above a surface of the blanket layer; and
   forming a contact metal layer over the stud structure and the surface of the blanket layer such that a topographical feature is formed within the contact metal layer above the stud structure, wherein the topographical feature comprises a step between first and second portions of the contact metal layer.

8. The method of claim 7, wherein the electrode is an upper electrode of a magnetoresistive random access memory (MRAM) device.

9. The method of claim 8, wherein selectively etching comprises wet etching.

10. The method of claim 9, wherein the blanket layer comprises TEOS oxide and the electrode comprises tantalum nitride (TaN).

11. The method of claim 10, wherein selectively etching the blanket layer and the upper electrode comprises dry etching the blanket layer and the upper electrode by sputtering with high energy Argon (Ar) and Nitrogen ($N_2$) ions.

12. The method of claim 8, wherein the MRAM device further comprises a magnetoresistive tunnel junction (MTJ).

13. A method for forming a magnetoresistive random access memory (MRAM) device comprising:
   forming an oxide layer over a substrate;
   forming a lower electrode over the oxide layer;
   forming a magnetoresistive tunnel junction (MTJ) over the lower electrode;
   forming an upper electrode over the MTJ;
   forming a blanket layer over the upper electrode;
   polishing the blanket layer until the upper electrode is exposed;
   selectively etching the blanket layer and the upper electrode to form a stud structure with the upper electrode that protrudes above a surface of the blanket layer; and
   forming a contact metal layer over the stud structure and the surface of the blanket layer such that a topographical feature is formed within the contact metal layer above the stud structure, wherein the topographical feature comprises a step between first and second portions of the contact metal layer.

14. The method of claim 13, wherein selectively etching comprises wet etching.

15. The method of claim 14, wherein the blanket layer comprises TEOS oxide and the electrode comprises tantalum nitride (TaN).

16. The method of claim 15, wherein selectively etching the blanket layer and the upper electrode comprises dry etching the blanket layer and the upper electrode by sputtering with high energy Argon (Ar) and Nitrogen ($N_2$) ions.

17. The method of claim 13, wherein the MTJ comprises:
a fixed magnetic layer formed on the lower electrode;
a dielectric tunnel baffler layer formed on the fixed magnetic layer; and
a free magnetic layer formed on the dielectric tunnel barrier layer.

\* \* \* \* \*

UNITED STATES PATENT AND TRADEMARK OFFICE
CERTIFICATE OF CORRECTION

| | | |
|---|---|---|
| PATENT NO. | : 7,494,825 B2 | Page 1 of 1 |
| APPLICATION NO. | : 11/649094 | |
| DATED | : February 24, 2009 | |
| INVENTOR(S) | : Butcher et al. | |

It is certified that error appears in the above-identified patent and that said Letters Patent is hereby corrected as shown below:

Column 8, line 3, "baffler" should be changed to --barrier--.

Signed and Sealed this

Nineteenth Day of May, 2009

JOHN DOLL
*Acting Director of the United States Patent and Trademark Office*